(12) United States Patent
Yu et al.

(10) Patent No.: US 8,138,832 B2
(45) Date of Patent: Mar. 20, 2012

(54) CLASS-D AMPLIFIER

(75) Inventors: Wen-Hao Yu, Hsinchu (TW); Min-Yuan Wu, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 22 days.

(21) Appl. No.: 12/889,700

(22) Filed: Sep. 24, 2010

(65) Prior Publication Data
US 2011/0133836 A1 Jun. 9, 2011

(30) Foreign Application Priority Data
Dec. 7, 2009 (TW) .............................. 98141773 A

(51) Int. Cl.
*H03F 3/217* (2006.01)
(52) U.S. Cl. .................................... 330/251; 330/207 A
(58) Field of Classification Search .................... 330/10, 330/207 A, 251
See application file for complete search history.

(56) References Cited

U.S. PATENT DOCUMENTS

| | | | |
|---|---|---|---|
| 4,249,136 A | 2/1981 | Suzuki et al. | |
| 6,707,337 B2* | 3/2004 | Noro | 330/251 |
| 7,463,090 B2* | 12/2008 | Kaiho et al. | 330/251 |
| 7,679,435 B2* | 3/2010 | Tsuji et al. | 330/10 |

FOREIGN PATENT DOCUMENTS
TW 565994 12/2003

OTHER PUBLICATIONS
State Intellectual Property Office of the People's Republic of China, "Office Action", Apr. 28, 2011, China.

* cited by examiner

*Primary Examiner* — Khanh Nguyen
(74) *Attorney, Agent, or Firm* — Winston Hsu; Scott Margo

(57) ABSTRACT

Class D amplifier is provided. The class D amplifier includes at least a block; each block includes an input circuit, an integrator, a comparator, a driving circuit and two feedback circuits. The input circuit receives a digital input to provide a differential pair of a positive and a negative input signals. The integrator receives the positive and negative input signals and a pair of positive and negative feedback signals for providing a positive error signal according to the positive input signal and the negative feedback signal, and providing a negative error signal according to the negative input signal and the positive feedback signal. The comparator compares between the positive and the negative error signals such that the driving circuit generates a driving output signal according to comparison result. The two feedback circuits respectively providing said positive and negative feedback signals according to the driving output signal.

15 Claims, 8 Drawing Sheets

CLASS-D AMPLIFIER

BACKGROUND

1. Technical Field

The present invention relates to a class-D amplifier, more particularly, to a class-D amplifier capable of resisting variation of common mode voltage and compensating output power loss by feedback compensation of duty.

2. Description of the Related Art

Amplifiers, such as power amplifiers, are applied to multimedia interface of various kinds of AV (audio and/or video) electronics for driving playback devices like speakers. Particularly, portable AV electronics have become one of the main streams of multimedia playback.

BRIEF SUMMARY

To match the size reduction trend of AV electronics, amplifiers driving playback devices are integrated into control/processing chips of AV electronics. Functions of control/processing (e.g., coding/decoding of multimedia files and/or baseband signal processing, etc.) can be implemented with digital logic circuits, while amplifier(s) for driving playback device(s) must be implemented by analog circuit of higher power and larger layout. To integrate both in a same chip (such as an ASIC, application-specific integrated circuit), quality and function of the amplifiers have to be enhanced within limited layout area.

Therefore, the invention provides an amplifier (e.g., a class-D amplifier) of high quality and high output power, which is capable of resisting variation of common mode voltage to enhance signal quality, and compensating output power degrading due to non-ideal factors of driving circuits and playback devices (such as resistance of driving circuits) by feedback compensation of duty. The invention applies to applications of limited layout area with specially preferred advantages.

An object of the invention is providing an amplifier (e.g., a class-D amplifier) which includes at least a block, each block includes an input circuit, an integrator, a comparator, a driving circuit and two feedback circuits. The input circuit receives a digital input and converts it to a differential pair of a positive input signal and a negative input signal; the digital input can be a digital input of pulse width modulation (PWM). The integrator can be of first order or of higher order, which has two differential receiving nodes, two differential feedback nodes and two differential output nodes. The two differential receiving nodes are coupled to the input circuit for respectively receiving the positive input signal and the negative input signal; the two differential feedback nodes respectively receive a positive feedback signal and a negative feedback signal. The integrator provides a positive error signal according to the positive input signal and the negative feedback signal, provides a negative error signal according to the negative input signal and the positive feedback signal, and respectively outputs the positive error signal and the negative error signal to the two differential output nodes as a differential pair. The comparator, coupled to the two differential output nodes of the integrator, compares magnitudes of the positive error signal and the negative error signal, and generates a corresponding comparison signal. The driving circuit is coupled to the comparator and generates a driving output signal to a driving output node according to the comparison signal. Each of the feedback circuits has a node coupled to the driving output node and another node coupled to one of the differential feedback nodes; the two feedback circuits respectively provide the positive feedback signal and the negative feedback signal according to the driving output signal.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
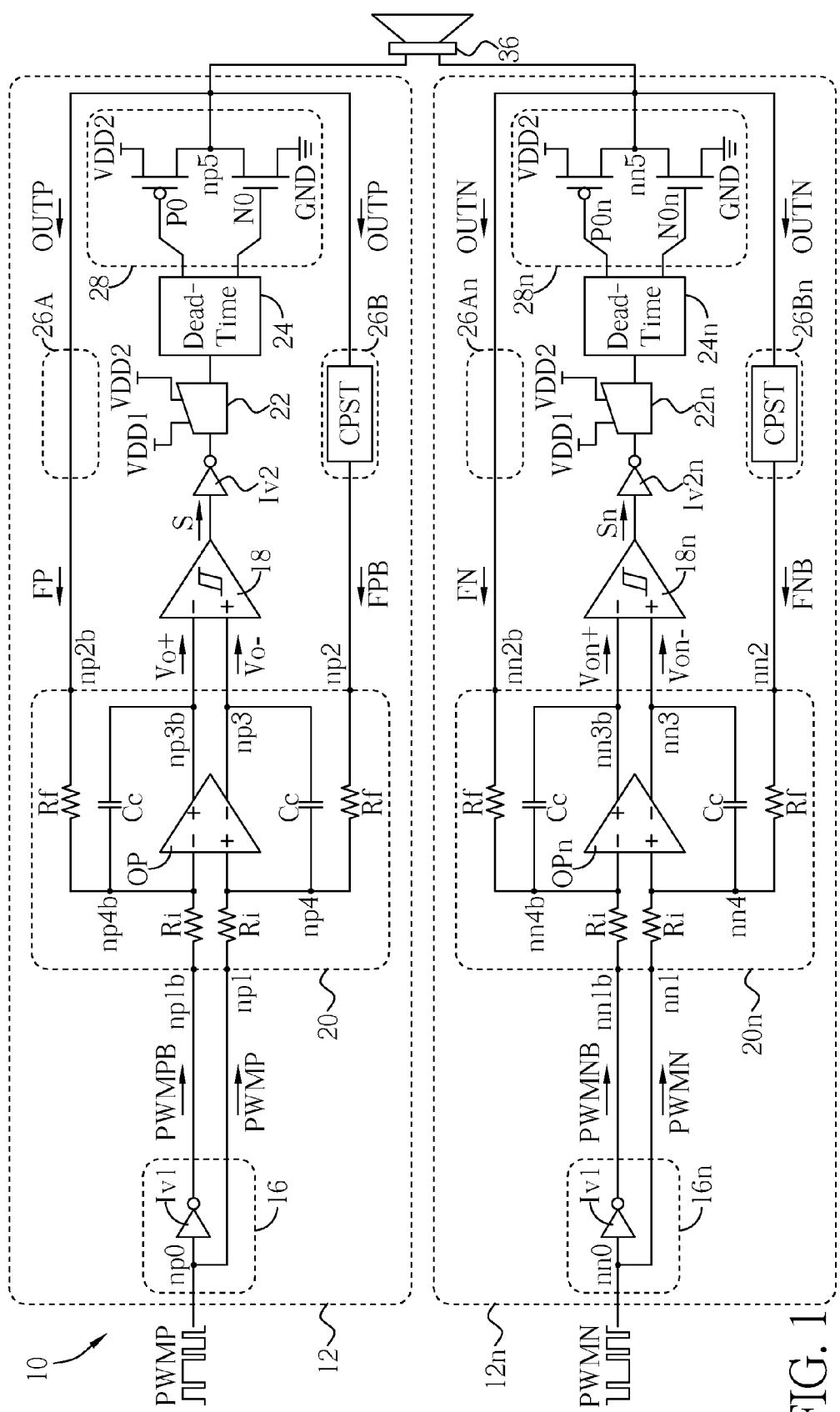
FIG. 1, FIG. 2 and FIG. 3 illustrate amplifiers according to different embodiments of the invention.

Please refer to FIG. 1. FIG. 1 illustrates architecture of an amplifier 10 according to an embodiment of the invention. The amplifier 10 includes two blocks 12 and 12n, the two blocks 12 and 12n respectively receive two digital inputs PWMP and PWMN of a differential pair, and are respectively coupled to two terminals of a playback device (e.g., a speaker 36) to form an H-bridge class-D amplifier for driving the speaker 36. In the embodiment of FIG. 1, the block 12 includes an input circuit 16, an integrator 20, a comparator 18, an inverter Iv2, an optional level shifter 22, a dead-time circuit 24, a driving circuit 28 and two feedback circuits 26A and 26B. The input circuit 16 receives the digital input PWMP from a node np0 and converts it to a positive input signal and a negative input signal of a differential pair; where the digital input PWMP can be a PWM digital signal. In the input circuit 16 of FIG. 1, the digital input PWMP is directly transmitted to be a positive input signal PWMP, and is inverted by the inverter Iv1 to be a negative input signal PWMPB.

The integrator 20 can be an integrator of first order or of higher order; in FIG. 1, an integrator of first order is exemplarily adopted to implement an embodiment of the invention. The integrator 20 includes a differential amplifier OP (e.g., an operational amplifier), a pair of matched resistors Ri, a pair of matched capacitors Cc and another pair of matched resistors Rf. The nodes np1 and np1b, as two differential receiving nodes of the integrator 20, are coupled to the input circuit 16 for receiving the positive input signal PWMP and the negative input signal PWMPB; the two resistors Ri are respectively coupled between the nodes np1 and np4, and the nodes np1b and np4b. The nodes np2 and np2b, as two differential feedback nodes of the integrator 20, respectively receive a negative feedback signal FPB and a positive feedback signal FP of a differential pair; and the two resistors Rf are respectively coupled between the nodes np2 and np4, and the nodes np2b and np4b. Furthermore, the nodes np3 and np3b act as two differential output nodes of the integrator 20; and the two capacitors Cc for signal integration are respectively coupled between the nodes np3 and np4, and the nodes np3b and np4b. Equivalently, the nodes np4 and np4b are two summing nodes: the former sums the positive input signal PWMP and the negative feedback signal FPB to be an integrating signal, and the latter sums the negative input signal PWMPB and the positive feedback signal FP to be the other integrating signal of a differential pair; thus the two differential inputs of the differential amplifier OP (labeled by "+" and "−" in FIG. 1) receive the two differential integrating signals at the nodes np4 and np4b with a two-terminal architecture. The two differential outputs (labeled by "+" and "−") are coupled to the nodes np3 and np3b, so the integrator 20 integrates to provide a positive error signal Vo+ according to sum of the positive input signal PWMP and the negative feedback signal FPB, and to provide a negative error signal Vo−, which forms a differential pair with the positive error signal Vo+, according to sum of the negative input signal PWMPB and the positive feedback signal FP.

The two inputs of the comparator 18 (marked by "+" and "−") are respectively coupled to the nodes np3 and np3b to receive the positive and negative error signals Vo− and Vo+, so the comparator 18 compares signal magnitudes of the positive error signal Vo+ and the negative error signal Vo− to generate a comparison signal S. The comparator 18 can be a comparator with hysteresis to resist noise in the positive/negative error signals Vo+ and Vo−. To adjust feedback phase of feedback path, the comparison signal S can be inverted by the inverter Iv2 to be transmitted to the optional level shifter 22.

In the block 12, the input circuit 16, the integrator 20, the comparator 18 and the inverter Iv2 can operate between the operation voltages VDD1 and GND (which defines a first operation voltage range); the dead-time circuit 24, the driving circuit 28 and the feedback circuits 26A and 26B can operate between the operation voltages VDD2 and GND (which defines a second operation voltage range), and the operation voltages VDD1 and VDD2 can be different; for example, the operation voltage VDD2 can be greater than the operation voltage VDD1. As such operation voltage scheme is adopted, the level shifter 22 is included between the inverter Iv2 and the dead-time circuit 24 to interface different operation voltage ranges (power domains). On the other hand, if an operation voltage scheme with the operation voltages VDD1 equal to VDD2 is adopted instead, the level shifter 22 is no longer required and the inverter Iv2 can be directed coupled to the dead-time circuit 24.

In the invention, the driving circuit 28 is couples to the comparator 18 (through the inverter Iv2 and the level shifter 22) to drive a corresponding driving output signal OUTP to the node np5, which acts as a driving output node, according to the comparison signal S. The driving circuit 28 includes a p-channel transistor P0 and an n-channel transistor N0; both the transistors can be power transistors, drains of the two transistors P0 and N0 are commonly coupled to the driving output node at the node np5, sources of the two transistors are respectively coupled to the operation voltages VDD2 and GND, and gates of the two transistors are coupled to the dead-time circuit 24, so the dead-time circuit 24 controls turn-on duration and timing of the transistors P0 and N0 according to the comparison signal S of the comparator 18. When a transition of the comparison signal S occurs to turn on one of transistors in the driving circuit 28 and turn off the other, the dead-time circuit 24 delays a short duration to turn on one of the transistors after the other one of the transistors is turned off, so the two transistors P0 and N0 will not turn on simultaneously, thus power waste and potential circuit damage can be avoided.

As the two feedback circuits 26A and 26B are respectively coupled between the nodes np5 and np2b and the nodes np5 and np2, the feed back circuits 26A and 26B respectively provide the positive feedback signal FP and the negative feedback signal FPB according to the driving output signal OUTP. In the embodiment of FIG. 1, the feedback circuit 26A directly transmits the driving output signal OUTP to be the positive feedback signal FP, and the feedback circuit 26B includes a compensation circuit CPST to generate the negative feedback signal FPB according to the driving output signal OUTP. As a cooperation result of the feedback circuits 26A and 26B, the positive and negative feedback signals FP and FPB are mutually inverted (out of phase) to form a differential pair with the same signal level ranges, and the signal level range of the positive/negative feedback signal FP/FPB will be different from that of the positive/negative feedback signal PWMP/PWMPB. Operation and embodiments of the feedback circuits and the compensation circuit will be described later.

In the amplifier 10, the other block 12n has the same and matched architecture with the block 12. Like the block 12, the block 12n has an input circuit 16n, an integrator 20n, a comparator 18n, an inverter Iv2n, an optional level shifter 22n, a dead-time circuit 24n, a driving circuit 28n and two feedback circuits 26An and 28An. The input circuit 16n receives a PWM digital input PWMN and converts it to the positive and negative input signal PWMN and PWMNB. The integrator 20n has two differential receiving nodes nn1 and nn1b respectively receiving the positive and negative input signals PWMN and PWMNB, two differential feedback nodes nn2 and nn2b respectively receiving a negative feedback signal FNB and a positive feedback signal FN of a differential pair, and two differential output nodes nn3 and nn3b respectively outputting a negative error signal Von− and a positive error signal Von+ of a differential pair. The comparator 18n compares magnitudes of the positive and negative error signals Von+ and Von− and outputs a corresponding comparison signal Sn, so the driving circuit 28n can drive a driving output signal OUTN at a driving output node of the node nn5. The two feedback circuits 26An and 26Bn respectively provide the positive and negative feedback signals FN and FNB according to the driving output signal OUTN. Because the digital inputs PWMP and PWMN are differential, the driving output signals OUTP and OUTN form a differential pair, too.

Figure 2:
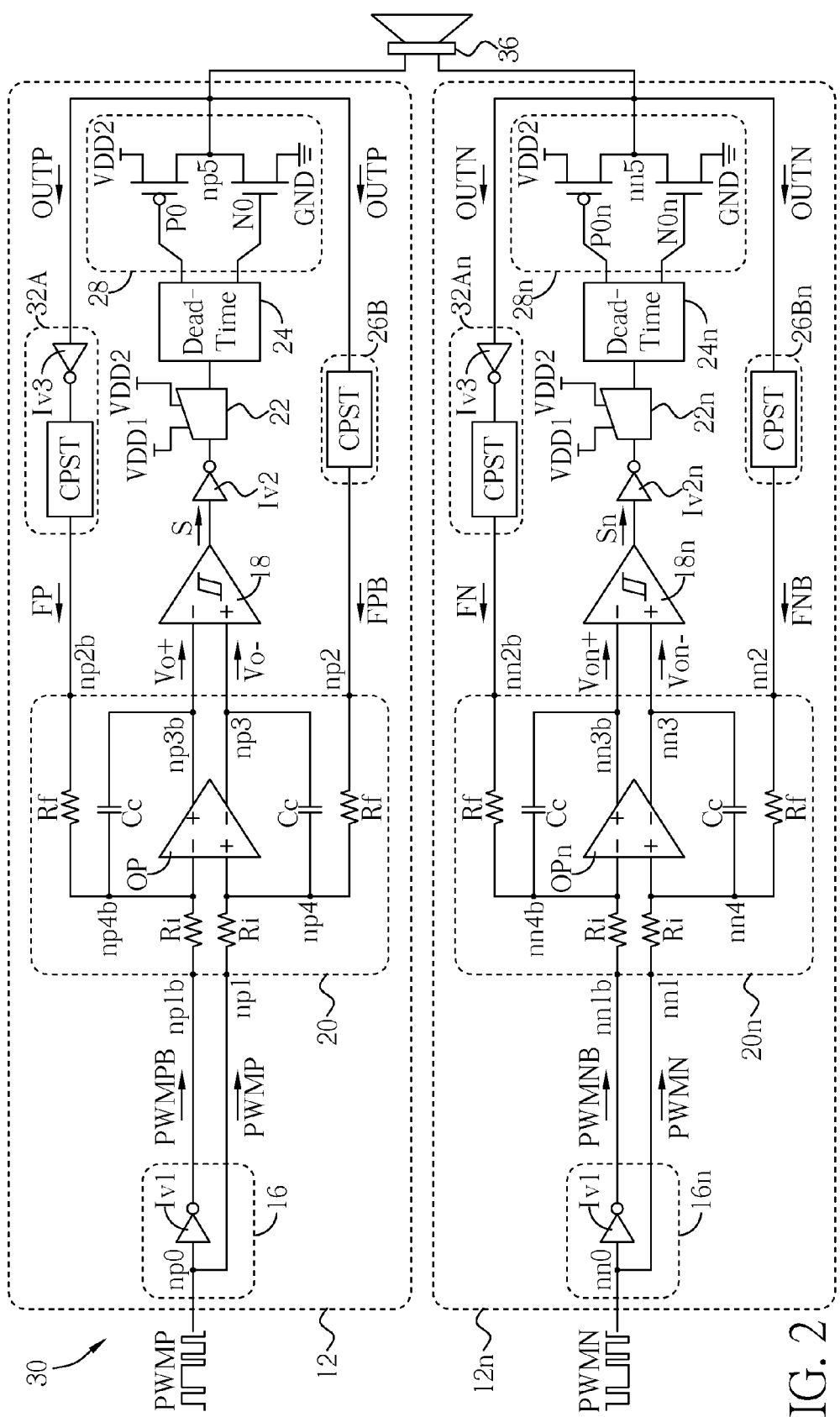

Please refer to FIG. 2 which illustrates architecture of an amplifier 30 according to another embodiment of the invention. Architecture and operation of the amplifier 30 is similar to those of the amplifier 10 in FIG. 1; the amplifier 30 also includes two blocks 12 and 12n. However, the block 12 of FIG. 2 adopts feedback circuits 32A and 26B as its two feedback circuits; the feedback circuit 26B can be the same as the feedback circuit 26B of FIG. 1, which is formed by a compensation circuit CPST. Instead, the feedback circuit 32A includes another compensation circuit CPST and an inverter Iv3. Similar to the feedback circuits 26A and 26B of FIG. 1, the two feedback circuits 32A and 26B work to provide a differential pair of positive and negative feedback signals FP and FPB with same signal level ranges, and to make the signal level range of the positive/negative feedback signal FP/FPB different from that of the positive/negative input signal PWMP/PWMPB. The same feedback circuit arrangement also applies to the feedback circuits 32An and 26Bn of the block 12n.

Figure 3:
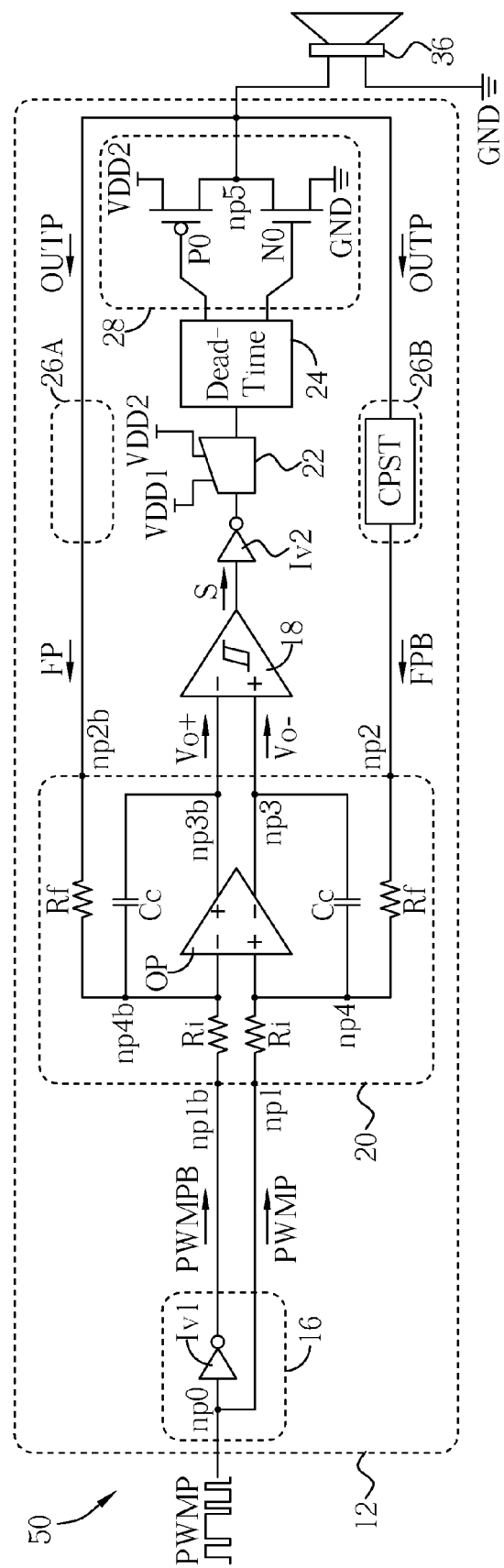

Please refer to FIG. 3, which illustrates an amplifier 50 according to another embodiment of the invention. In this embodiment, the architecture of the amplifier 50 includes a single block 12 to implement a half-bridge class-D amplifier. In this embodiment, the node np5, as the driving output node, is coupled to one terminal of the speaker 36, with the other terminal of the speaker 36 coupled to the operation voltage GND (a ground). In the embodiment of FIG. 3, the block 12 follows architecture of the block 12 in FIG. 1; however, the block 12 in FIG. 2 can be adopted in FIG. 3, too.

Figure 4:
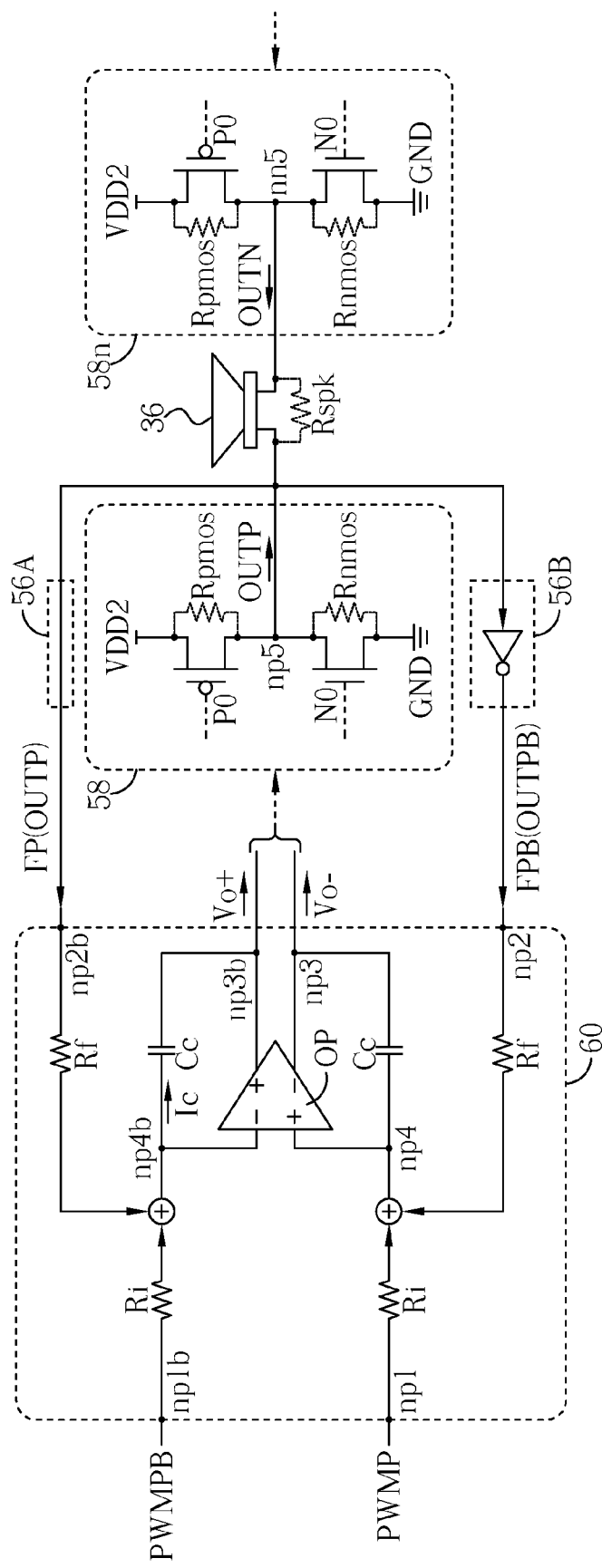
FIG. 4 is a simplified illustration of an amplifier.
Figure 5:
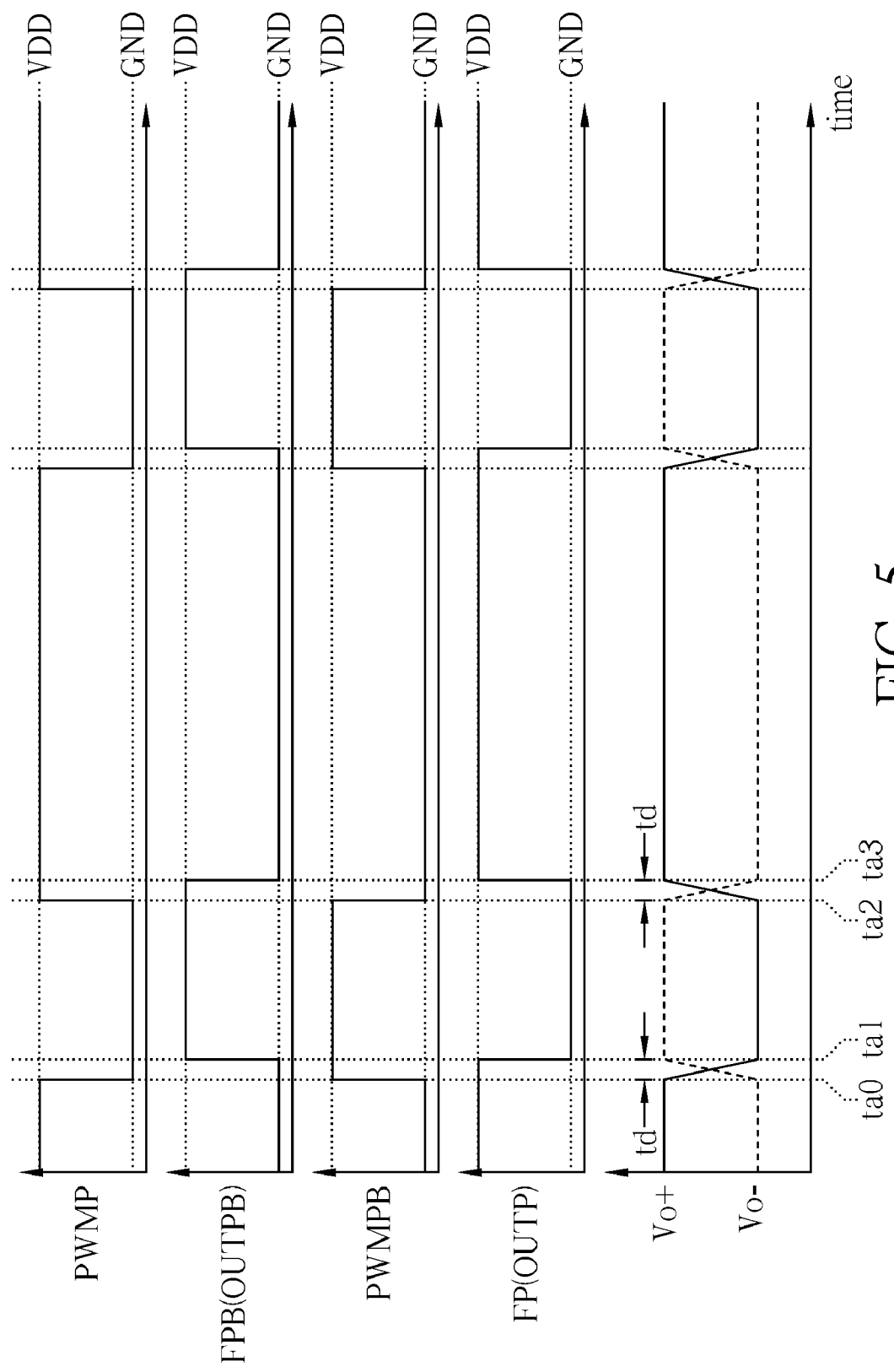
FIG. 5 illustrates signal timing and waveform diagrams of the amplifier in FIG. 4.

Please refer to FIG. 4 and FIG. 5, which demonstrate an amplifier embodiment to illustrate ideal amplifier operation free from interference of non-ideal factors; FIG. 4 gives a simplified illustration to show main circuit architecture of the amplifier, and FIG. 5 illustrates waveform and timing diagrams of signals in FIG. 4. Similar to the embodiment of FIG. 1, an integrator 60 receiving differential integrating signals with two-terminal architecture is adopted in FIG. 4; the integrator 60 outputs the positive and negative error signals Vo+ and Vo− respectively according to sum of the positive input signal PWMP and the negative feedback signal FPB, and sum of the negative input signal PWMPB and the positive feedback signal FP. Based on the positive and negative error signals Vo+ and Vo−, a driving circuit 58 outputs a corresponding driving output signal OUTP. Two feedback circuits 56A and 56B respectively provide the positive and negative feedback signals FP/FPB according to the driving output signal OUTP. In this embodiment, the feedback circuit 56A directly transmits the driving output signal OUTP to be the positive feedback signal FP, and the feedback circuit 56B provides a signal OUTB, inverted from the driving output signal OUTP, to be the negative feedback signal FPB. Furthermore, a driving circuit 58n of another block (with portions not demonstrated) also outputs a corresponding driving output signal OUTN to drive the speaker 36 together with the driving output signal OUTP.

Following the embodiment of FIG. 4, waveforms of the positive/negative input signal PWMP/PWMPB, the driving output signal OUTP/OUTN and the positive/negative error signal Vo+/Vo− are shown in FIG. 5; the transverse and longitudinal axes of each waveform respectively represent time and magnitude (e.g., voltage amplitude of waveform). For convenience of discussion, it is assumed that the integrator 60 and the driving circuits 58 and 58n operate in a same operation voltage VDD (i.e., VDD1=VDD2=VDD), so the digital positive and negative input signals PWMP and PWMPB swings between operation voltages VDD and GND; that is, the positive/negative input signal PWMP/PWMPB has a signal level range between operation voltages VDD and GND. Also, it is assumed that resistances of the resistors Ri and Rf are equal to R.

Under ideal circumstance, turn-on resistors Rpmos and Rnmos of the transistors P0 and N0 are zero, so ideally the signal level range of the driving output signal OUTP/OUTN is between the operation voltages VDD and GND. For example, when the transistor P0 of the driving circuit 58 and the transistor N0 of the driving circuit 58n simultaneously turn on, no cross voltage appears across drain and source of the turned-on transistor due to zero resistances of the resistors Rpmos and Rnmos, so a complete voltage difference between the operation voltages VDD and GND fully contributes to an equivalent load resistor Rspk of the speaker 36, then the signal level of the driving output signal OUTP can be pulled up to reach the operation voltage VDD, and the signal level of the driving output signal OUTN can be pulled down to reach the operation voltage GND.

In FIG. 5, the relation between the positive/negative input signal PWMP/PWMPB, the positive/negative feedback signal FP/FPB (signals OUTP/OUTPB) and the positive/negative error signal Vo+/Vo− can be described as follows. At time ta0, signal transitions occur in the positive and negative signals PWMP/PWMPB, so the positive and negative error signals Vo+ and Vo− start to transit due to the operation of the integrator 60. Because the signal transition of the positive/negative error signal Vo+/Vo− is triggered by signal integration, there is a transition delay td dependent on resistance of the resistor R and capacitance of the capacitor Cc. At time ta1, the transition of the positive/negative error signal Vo+/Vo− is enough to trigger signal transition of the driving output signal OUTP/OUTN of the driving circuit 58/58n, as well as signal transition of the positive/negative feedback signal FP/FPB (i.e., the signal OUTP/OUTPB). After time ta1, because signal level ranges of the positive/negative input signal and the positive/negative feedback signal are the same, the sum of the positive input signal PWMP and the negative feedback signal FPB (the signal OUTPB) cancels to prevent charging and/or discharging of the capacitor Cc, so the positive error signal Vo+ is kept in a fixed steady-state level. Similarly, the negative error signal Vo− is kept in another fixed steady-state level after time ta1 due to the sum cancellation of the negative input signal PWMPB and the positive feedback signal FP (the signal OUTP). For the same reason, when the positive/negative input signal PWMP/PWMPB transits again at time ta2, the positive/negative error signal Vo+/Vo− will keep a steady-state fixed level after time ta3

In other words, under ideal circumstance shown in FIG. 4 and FIG. 5, because the signal level ranges of the driving output signal OUTP/OUTN and the positive/negative feedback signal FP/FPB are the same as the signal level range of the positive/negative input signal PWMP/PWMPB, the positive/negative error signal Vo+/Vo− only transits between two fixed level, and the rise time and fall time during signal transition of the positive/negative error signal will be the same as a result. For example, the delay td between time ta0 and ta1 and that between time ta2 and ta3 are the same.

In practical implementation, however, each power transistor in the driving circuit has a non-zero turn-on resistor Rpmos or Rnmos. Particularly, In applications of limited layout area, the turn-on resistor has considerable resistance which can not be ignored. The non-ideal factors of turn-on resistors degrade output power of the driving circuit because a portion of power is consumed by the turn-on resistors of transistors in the driving circuit. Comparing the power practically outputted to the speaker and the total power drained by the driving circuit, a ratio between them can be calculated by Rspk/(Rspk+Rpmos+Rnmos), which fails to reach an ideal ratio of 100%. Furthermore, as the resistance of the resistor Rpmos/Rnmos also varies due to variation of process, operation voltages and temperature, practical output power become more unpredictable. Non-zero turn-on transistors Rpmos and Rnmos also decrease signal level range of the driving output signal OUTP/OUTN; because the voltage drop across the resistor Rpmos/Rnmos is not zero, the cross voltage of the speaker 36 (the voltage cross the resistor Rspk) suffers a reduced signal level range between voltages (VDD−VDP) and (GND+VDN) instead of the ideal full range between voltages VDD and GND shown in FIG. 5, where the voltage drop VDP due to non-zero turn-on resistors can be estimated as: VDP=VDD*Rpmos/(Rspk+Rpmos+Rnmos); and the voltage drop VDN is: VDN=VDD*Rnmos/(Rspk+Rpmos+Rnmos).

Figure 6:
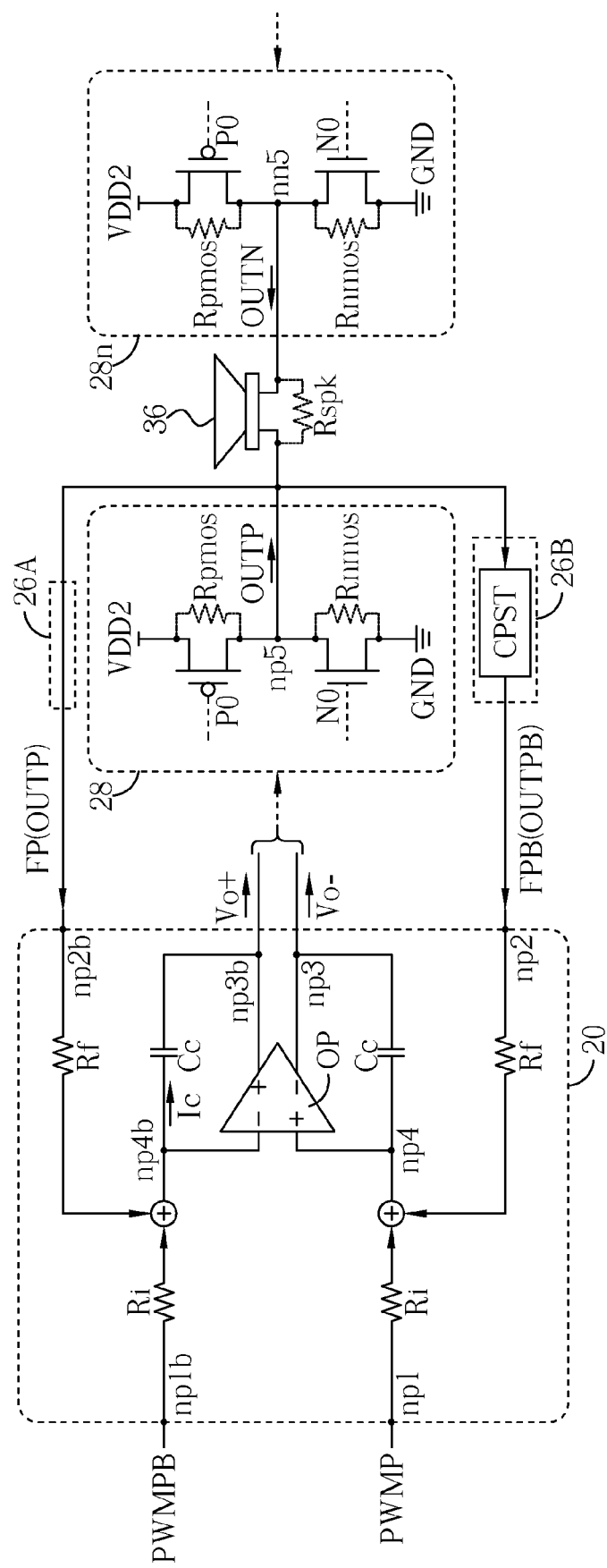
FIG. 6 is a simplified illustration of another amplifier.
Figure 7:
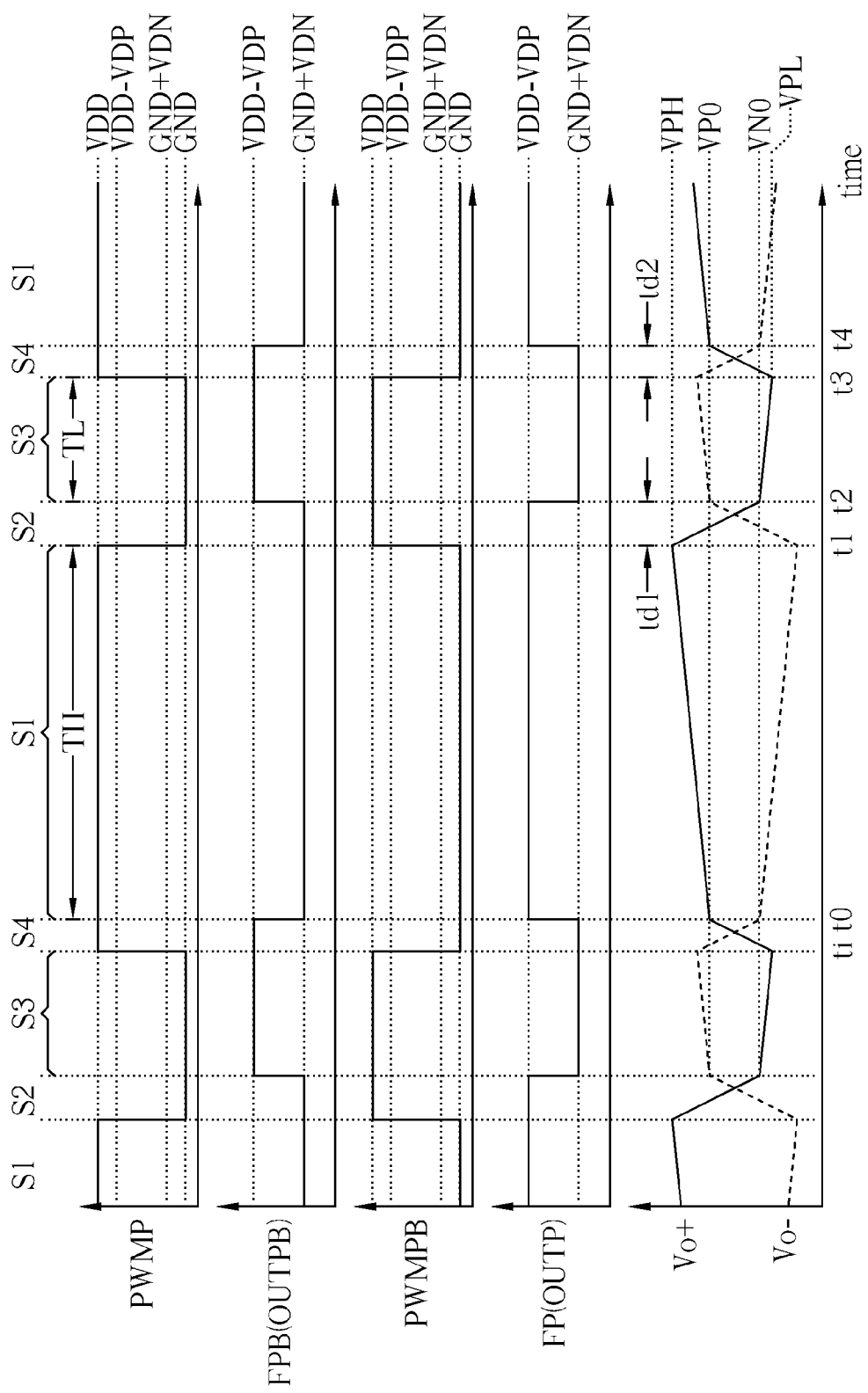
FIG. 7 illustrates signal timing and waveform diagrams of the amplifier in FIG. 6.

Please refer to FIG. 6 and FIG. 7, which illustrate principles and operations to compensate aforementioned non-ideal factors by the amplifier of the invention following the embodiment of FIG. 1. FIG. 6 demonstrates a simplified illustration of the main circuit architecture of the amplifier 10, and FIG. 7 illustrates waveforms and timing diagrams of related signals in FIG. 6. As shown in the example of FIG. 6, the feedback circuit 26A directly transmits the driving output signal OUTP to be the positive feedback signal FP, while the compensation circuit CPST in the feedback circuit 26B generates a signal OUTPB by an inversion according to the driving output signal OUTP, to be the negative feedback signal FPB. The compensation circuit CPST sets the negative feedback signal FPB and the positive feedback signal FP (i.e., the signal OUTP) mutually inverted to form a differential pair, and keeps the signal level range of the negative feedback signal FPB equal to that of the positive feedback signal FP; that is, in this embodiment, the compensation circuit CPST keeps the signal level range of the signal OUTPB tracking that of the driving output signal OUTP. Implementation embodiments of the compensation circuit CPST will be discussed later.

For convenience of discussion, it is also assumed that the integrator 20 and the driving circuit 28 operate between the operation voltages VDD and GND, the operation voltage GND is zero, the resistors Ri and Rf are have resistances equal to that of a resistor R, and the differential amplifier OP is fed with a common mode voltage (VDD+GND)/2. As shown in FIG. 7, the signal level ranges of the digital positive and negative input signals PWMP/PWMPB are between the operation voltages VDD and GND. However, owing to non-zero turn-on transistor resistors of the driving circuits 28 and 28n, the signal level range of the output driving signal OUTP falls between (VDD−VDP) and (GND+VDN). Because of the operation of the feedback circuits 26A and 26B, the signal level ranges of the negative and positive feedback signals FP and FPB approach to be the same.

In FIG. 7, relations of the positive/negative input signal PWMP/PWMPB, the positive/negative feedback signal FP/FPB and the positive/negative error signal Vo+/Vo− can be respectively described for periods S1 to S4. First, in the period S1, though the positive/negative input signal PWMP/PWMPB and the positive/negative feedback signal FP/FPB maintain constant levels of steady-state, these two pair of signals have different signal level ranges, so a current Ic=VDN/R charges the capacitor Cc, and the positive and negative error signals Vo+ and Vo− keep changing their signal levels. As the signal levels of the positive and negative error signals Vo+ and Vo− are respectively VP0 and VN0 at time t0, the positive error signal Vo+ rises to a voltage VPH=VP0+VDN*TH/(R*Cc) after an interval TH.

At time t1, the positive and negative input signals PWMP and PWMPB transit; as a result, the positive and negative error signal Vo+ and Vo− start to change trends of rising/falling. At time t2, the positive and negative error signal Vo+ and Vo− respectively reach voltages VN0 and VP0, which are enough to trigger signal transitions of the driving output signals OUTP and OUTPN driven by the driving circuits 28 and 28n; so the signals OUTP and OUTPB (the positive and negative feedback signals FP and FPB) follow to change signal levels, and again the positive and negative error signals Vo+ and Vo− change their trend of rising/falling. In the period S2 between time t1 and t2, a delay time td1 for the positive error signal Vo+ to drop from voltage VPH to voltage VN0 is calculated as: td1=R*Cc*(VP0−VN0+(VDN*TH)/(R*Cc))/(VDD−VDN).

After time t2, though the positive/negative input signal PWMP/PWMPB and the positive/negative feedback signal FP/FPB remain steady-state, the differences between these two pairs of signals again dis/charge to introduce lasting changes in the positive and negative error signals by the current Ic=−VDP/R. For example, the positive error signal Vo+ falls from the voltage VN0 at time t2 to a voltage VPL=VN0−VDP*TL/(R*Cc) after an interval TL.

At time t3, the positive and negative input signal PWMP/PWMPB change signal levels again and therefore cause a reverse in the rising/falling trends of the positive and negative error signals Vo+ and Vo−. At time t4, the positive and negative error signals Vo+ and Vo− respectively reach voltages VP0 and VN0 again, so the driving circuits 28 and 28n are triggered to respectively drive signal transitions in the driving output signals OUTP and OUTN; consequently, the signals OUTP and OUTPB (the positive and negative feedback signals FP and FPB) changes their signal levels, and the positive/negative error signals Vo+ and Vo− change their rising/falling trends again. During the period S4 between time t3 and time t4, a delay time td2 for the positive error signal Vo+ to rise from the voltage VPL to the voltage VP0 is given by: td2=R*Cc*(VP0−VN0+(VDP*TL)/(R*Cc))/(VDD−VDP).

During the periods S2 and S4, the rising/falling trends of the positive and negative error signals Vo+ and Vo− reverse, so the delay times td1 and td2 during these two periods can be respectively considered as a rising time and a falling time of the pair of signals. According to aforementioned calculations, the delay times td1 and td2 are different; by assuming VDN=VDP=VD, the difference between the delay times is calculated as: td1−td2=VD*(TH−TL)/(VDD−VD). The delay time difference is used to compensate amplifier output power loss caused by the non-ideal factors. For example, as shown in the example of FIG. 7, the positive input signal PWMP maintains a logic high level of the voltage VDD between time ti and time t1, the response of the amplifier works to have the driving output signal OUTP maintained in a high level of voltage (VDD−VDP) from time t0 to time t2. If the time interval for the driving output signal OUTP to maintain the high level is equal to that for the positive input signal PWMP to maintain logic high (such as the example shown in FIG. 5), the output power of the driving output signal OUTP can not be compensated since the voltage level of the driving output signal OUTP is lower than that of the positive input signal PWMP owing to the non-ideal factors. However, as the invention is applied, the time interval for the driving output signal OUTP to maintain the high level is (TH+td1), while that for the input signal PWMP to maintain the logic high is (TH+td2), as shown in FIG. 7. Because of the difference between the delay times td1 and td2, the time interval for the driving output signal OUTP to remain a high level can be relatively extended to compensate power loss of non-ideal factors.

In other words, according to the signal level difference between the positive/negative input signal and the positive/negative feedback signal introduced by the invention, the positive and negative error signals can keep changing their signal levels during the periods S1 and S3 to introduce a difference between the rising time and falling time during the periods S2 and S4, so the duty of the driving output signals are compensated, and the output power of the disclosed amplifier can be improved.

Figure 9:
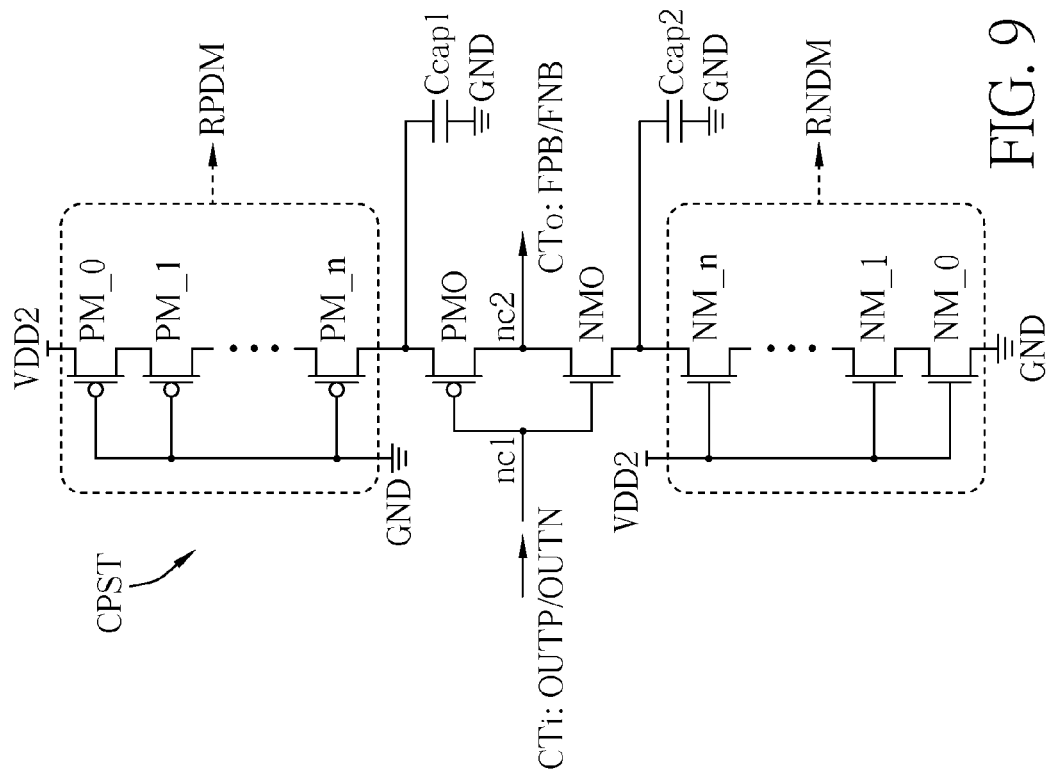
FIG. 8 and FIG. 9 illustrate compensation circuits according to different embodiments of the invention.
Figure 8:
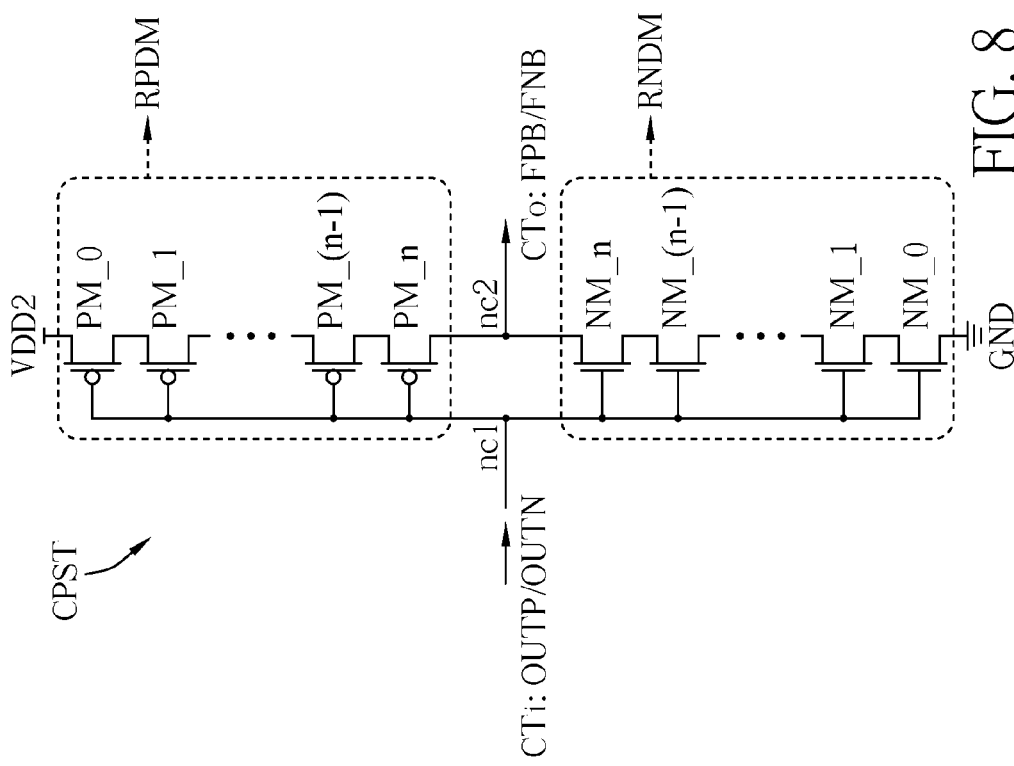

Please refer to FIG. 8 and FIG. 9 respectively illustrating two embodiments of the compensation circuit CPST of the invention. The compensation circuit CPST in the feedback circuit receives an indication signal CTi from an input terminal (node) nc1 and generates an inverted compensation signal CTo to an output terminal (node) nc2. The feedback circuit provides the indication signal to the compensation circuit according to the driving output signal, and then provides the positive feedback signal or the negative feedback signal according to the compensation signal. For example, in the embodiments of FIG. 1 and FIG. 3, the compensation circuit CPST of the feedback circuit 26B/26Bn receives the driving output signal OUTP/OUTN from the input node nc1 coupled to the node np5/nn5, and provides the compensation signal CTo to be the negative feedback signal FPB/FNB of the node np2/nn2. In the embodiment of FIG. 2, the feedback circuit 32A/32An inverts the driving output signal OUTP/OUTN by the inverter Iv3 to be inputted to the compensation circuit CPST.

In the embodiments of FIG. 1 and FIG. 3, the compensation circuit CPST keeps the signal level range of the compensation signal CTo tracking that of the driving output signal OUT/OUTP. As previously discussed, the signal level range of the driving output signal OUTP/OUTN is between the voltages (VDD2−VDP) and (GND+VDN) due to influence of the non-ideal factors; to keep the signal level range of the compensation signal CTo following this signal level range, the compensation circuit CPST shown in FIG. 8 includes a plurality of p-channel transistors PM_0, PM_1 to PM_n, and a plurality of n-channel transistors NM_0 to NM_n, wherein n is a constant integer. In these transistors, the p-channel transistor PM_0 has a source coupled to the operation voltage VDD2, the p-channel transistor PM_n has a drain coupled to the output node nc2, and each of the p-channel transistors PM_0 to PM_(n−1) has a drain coupled to a source of another. Symmetrically, the n-channel transistor NM_0 has a source coupled to the operation voltage GND, the n-channel transistor NM_n has a drain coupled to the output node nc2, and the drain of each of the rest n-channel transistors NM_0 to NM_(n−1) is coupled to a source of another. The gates of the p-channel transistors PM_0 to PM_n are coupled to the input node nc1, the gates of the n-channel transistors NM_0 to NM_n are also coupled to the input node nc1.

In FIG. 8, the transistors PM_n and NM_n can be regarded as an basic inverter, the transistors PM_0 to PM_(n−1) and the transistors NM_0 to NM_(n−1) respectively forms two auxiliary circuits. When the transistors PM_0 to PM_n turn on to conduct, these transistors provide a first cross voltage between the operation voltage VDD2 and the node nc2, so a signal level upper limit of the compensation signal CTo is lower than the operation voltage VDD2; similarly, when the transistors NM_0 to NM_n tun on, they provide a second cross voltage between the node nc2 and the operation voltage GND, such that a signal level lower limit of the compensation signal CTo can be set higher than the operation voltage GND. By proper circuit design, the first cross voltage approaches the voltage VDP and the second cross voltage approaches the voltage VDN, so the compensation circuit CPST can keep the signal level range of the compensation signal CTo tracking that of the driving output signal OUTP/OUTN.

Equivalently, the source-drain turn-on resistors of the transistors PM_0 to PM_n are connected in serial to form a resistor RPDM, those of the transistors NM_0 to NM_n are connected in serial to become a resistor RNDM. The aforementioned circuit design aims to have an I-R (current-resistance) drop across the turned-on transistors PM_0 to PM_n approaching/equaling the voltage VDP, and an I-R drop across the turned-on transistors NM_0 to NM_n approaching/equaling the voltage VDN.

In the embodiment of FIG. 9, the compensation circuit CPST includes a plurality of p-channel transistors PM_0, PM_1 to PM_n and PMO, and a plurality of n-channel transistors NM_0 to NM_n and NMO. In these transistors, a source of the p-channel transistor PM_0 is coupled to the operation voltage VDD2, a drain of the p-channel transistor PMO is coupled to the output node nc2, and the drain of the rest p-channel transistors PM_0 to PM_n couples to the source of another. In addition, a source of the n-channel transistor NM_0 is coupled to the operation voltage GND, a drain of the n-channel transistor NMO is coupled to the output node nc2, and the drain of each of the rest n-channel transistors NM_0 to NM_n is coupled to the source of another. Gates of the p-channel transistors PM_0 to PM_n are coupled to the operation voltage GND, while gates of the n-channel transistors NM_0 to NM_n are coupled to the operation voltage VDD2. The source of the p-channel transistor PMO is further coupled to a capacitor Ccap1, and the source of the n-channel transistor NMO is further coupled to a capacitor Ccap2, also.

In FIG. 9, the transistors PMO and NMO forms a basic inverter, the transistors PM_0 to PM_n and the transistors NM_0 to NM_n respectively form two auxiliary circuits. When the transistors PM_0 to PM_n turn on, these transistors provide a first cross voltage between the operation voltage VDD2 and the node nc2, so the signal level upper limit of the compensation signal CTo is lower than the operation voltage VDD2; similarly, the transistors NM_0 to NM_n turn on to provide another second cross voltage between the node nc2 and the operation voltage GND, such that the signal level lower limit of the compensation signal CTo is set higher than the operation voltage GND. Similar to the embodiment of FIG. 8, the first and second cross voltages can respectively be set to approach the voltage VDP and VDN through proper circuit design (e.g., properly selecting channel length/quantity/width of the transistors PM_0 to PM_n and NM_0 to NM_n, as well as channel length and/or width of the transistors PMO and/or NMO), so the compensation circuit CPST in FIG. 9 can make the signal level range of the compensation signal CTo track that of the driving output signal OUTP/OUTN.

Equivalently, the turn-on resistors between source-drain of the transistors PM_0 to PM_n are connected in serial to form a resistor RPDM, and those of the transistors NM_0 to NM_n are connected in serial to become a resistor RNDM. The aforementioned circuit design aims to have an I-R (current-resistance) drop across the turned-on transistors PM_0 to PM_n approaching/equaling the voltage VDP, and an I-R drop across the turned-on transistors NM_0 to NM_n approaching/equaling the voltage VDN. In the embodiment of FIG. 9, the capacitors Ccap1 and Ccap2 will be respectively pre-charged to the operation voltages VDD2 and GND to speed up signal transition of the compensation circuit and to improve slew rate of the compensation circuit and the class-D amplifier.

In the embodiments of FIG. 1 to FIG. 3, one of the functions of the feedback circuits 26A/26B and 32A/26B is to make the positive and negative feedback signals FP and FPB have the same signal level ranges, and have their signal level ranges different from those of the positive and negative input signals PWMP and PWMPB, so the power loss caused by non-ideal factors can be compensated according to principles shown in FIG. 7. In FIG. 1 and FIG. 3, because the feedback circuits 26A transmits the driving output signal OUTP as the positive feedback signal FP, the compensation signal CPST in the feedback circuit 26B works to make the signal level range of the negative feedback signal FPB track that of the driving output signal OUTP; therefore, the compensation circuit CPST can be designed according to the transistors P0 and N0 in the driving circuit 28.

In the embodiment of FIG. 2, because both the feedback circuits 32A and 26B include compensation circuits CPST, the resultant positive and negative feedback signal FP and FPB will have the same signal level range as the feedback circuits 32A and 26B match each other, and then the principles of FIG. 7 can be followed. Also, the compensation circuit CPST in the embodiment of FIG. 2 can be designed according to the driving circuit 28 to maintain the same signal level ranges for the positive and negative feedback signals FP and FPB.

To sum up, comparing to integrators receiving integrating signals with single-end (one-terminal), the integrator of the invention receives differential integrating signals with double-end (two-terminal) architecture to resist negative impacts (e.g., noise and distortions like harmonic distortion) of common mode voltage variation and drifting. The differential amplifier in the integrator of the invention can adopt a common mode voltage selected in general ways (e.g., selecting (VDD1+GND)/2 as the common mode voltage); though the common mode voltage may vary with variations of process, temperature and operation voltages, variation of common mode voltage and noise can be cancelled by the two-terminal differential receiving architecture of the integrator. The integrator adopted in the invention can be of a first order or of higher order; in the embodiments of FIG. 1 to FIG. 3, a differential amplifier OP is used to implement a first order integrator. Two sets of integrators can be serial connected to implement a second order integrator. Integrator of higher order can be implemented with more sets of first order integrator connected in serial.

In addition, as discussed in FIG. 7 of the invention, specially designed compensation circuits in feedback circuits are used to compensate output power loss, so the amplifier of the invention is particularly applicable to applications suffering from limited layout areas and serious non-ideal factors, such as applications involving ASICs integrated with digital circuits.

In a typical application without the invention techniques, an amplifier with rated output power of 200 mW only has a practical output power of 152 mW, or an even lower output power of 132 mW due to influences of process and temperature. On the contrary, as the invention applies to an amplifier with rated output power of 200 mW, the amplifier can have a practical output power of 177 mW or even 198 mW to approximate ideal rated output power. Thus it proves that the invention can actually improve performances of power amplifiers (class-D amplifiers in particular).

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An amplifier, comprising:
at least a block, each block comprising:
an input circuit receiving a digital input and converting the digital input to a differential pair of a positive input signal and a negative input signal;
an integrator having two differential receiving nodes, two differential feedback nodes and two differential output nodes; the two differential receiving nodes coupled to the input circuit respectively receiving the positive input signal and the negative input signal; the two differential feedback nodes respectively receiving a positive feedback signal and a negative feedback signal; wherein the integrator provides a positive error signal according to the positive input signal and the negative feedback signal, and provides a negative error signal according to the negative input signal and the positive feedback signal, and outputs the positive error signal and the negative error signal to the two differential output nodes;
a comparator, coupled to the two differential output nodes of the integrator, comparing magnitudes of the positive error signal and the negative error signal and generating a corresponding comparison signal;
a driving circuit coupled to the comparator; the driving circuit generating a driving output signal to a driving output node according to the comparison signal; and
two feedback circuits, each of the feedback circuits having a node coupled to the driving output node and another node coupled to one of the differential feedback nodes; the two feedback circuits respectively providing the positive feedback signal and the negative feedback signal according to the driving output signal.

2. The amplifier of claim 1, wherein the digital input is a digital input of pulse width modulation.

3. The amplifier of claim 1, wherein the two feedback circuits set the positive feedback signal and the negative feedback signal to be mutually differential.

4. The amplifier of claim 1, wherein one of the two feedback circuits provides the negative feedback signal according to a signal out of phase with the driving output signal, and the other feedback circuit provides the positive feedback signal according to a signal in phase with the driving output signal.

5. The amplifier of claim 1, wherein at least one of the two feedback circuits comprises a compensation circuit, provides an indication signal to the compensation circuit according to the driving output signal, and provides one of the positive feedback signal and the negative feedback signal according to a compensation signal; wherein the compensation circuit receives the indication signal and provides the compensation signal inverted with a signal level range tracking that of the driving output signal.

6. The amplifier of claim 5, wherein the compensation circuit comprises:
a plurality of p-channel transistors, a first one of the p-channel transistors having a source coupled to a first operation voltage, a second one of the p-channel transistors having a drain coupled to an output terminal, and each of the rest p-channel transistors having a drain coupled to a source of another; and
a plurality of n-channel transistors, a first one of the n-channel transistors having a source coupled to a second operation voltage, a second one of the n-channel transistors having a drain coupled to the output terminal, and each of the rest n-channel transistors having a drain coupled to a source of another;
wherein at least one of the p-channel transistors has a gate coupled to an input terminal, at least one of the n-channel transistors has a gate coupled to the input terminal, and the compensation circuit receives the indication signal from the input terminal and generates the compensation signal to the output terminal.

7. The amplifier of claim 6, wherein at least one of the p-channel transistors in the compensation circuit has a gate coupled to the second operation voltage, and at least one of the n-channel transistors has a gate coupled to the first operation voltage.

8. The amplifier of claim 7, wherein one of the p-channel transistors in the compensation circuit has a source further coupled to a capacitor, and one of the n-channel transistors has a source further coupled to another capacitor.

9. The amplifier of claim 1, wherein the two feedback circuits set signal level ranges of the positive feedback signal and the negative feedback signal different from those of the positive input signal and the negative input signal.

10. The amplifier of claim 9, wherein at least one of the two feedback circuits comprises a compensation circuit, provides an indication signal to the compensation circuit and provides one of the positive feedback signal and the negative feedback signal according to a compensation signal; the compensation circuit, which receives the indication signal from an input terminal and generates the compensation signal to an output terminal, comprises:
- a p-channel transistor and an n-channel transistor with gates coupled to the input terminal and drains coupled to the output terminal;
- a first auxiliary circuit coupled between a source of the p-channel transistor and a first operation voltage; wherein when the p-channel transistor conducts, the first auxiliary circuit provides a cross voltage between the first operation voltage and the source of the p-channel transistor for setting a signal level upper limit of the compensation signal lower than the first operation voltage; and
- a second auxiliary circuit coupled between a source of the n-channel transistor and a second operation voltage; wherein when the n-channel transistor conducts, the second auxiliary circuit provides a cross voltage between the second operation voltage and the source of the n-channel transistor for setting a signal level lower limit of the compensation signal higher than the second operation voltage.

11. The amplifier of claim 9, wherein the integrator sets rise time of the positive error signal and the negative error signal different from fall time of the positive error signal and the negative error signal according to differences of signal level ranges set between the positive input signal, the negative input signal, the positive feedback signal and the negative feedback signal by the feedback circuits.

12. The amplifier of claim 1 having two blocks, wherein the two blocks respectively receiving a differential pair of two digital inputs, and the driving output nodes of the two blocks are respectively coupled to two terminals of a speaker.

13. The amplifier of claim 1, wherein the integrator is of first order or of higher order.

14. The amplifier of claim 1, wherein the driving circuit comprises:
- a p-channel transistor and an n-channel transistor; drains of the p-channel transistor and the n-channel transistor coupled to the driving output node, sources of the p-channel transistor and the n-channel transistor respectively coupled to a first operation voltage and a second operation voltage;

and the block further comprises:
- a dead-time circuit, coupled between gates of the p-channel transistor and the n-channel transistor, controlling conducting duration of the p-channel transistor and the n-channel transistor according to the comparison signal.

15. The amplifier of claim 1, wherein the integrator and the comparator operate in a first operation voltage range; the driving circuit and at least one of the two feedback circuits operate in a second operation voltage range; the first operation voltage range is different from the second operation voltage range; and the block further comprises:
- a level shifter coupled between the comparator and the driving circuit.

* * * * *